United States Patent [19]
Coburn

[11] Patent Number: 6,023,160
[45] Date of Patent: *Feb. 8, 2000

[54] ELECTRICAL METERING SYSTEM HAVING AN ELECTRICAL METER AND AN EXTERNAL CURRENT SENSOR

[75] Inventor: David Carl Coburn, Somersworth, N.H.

[73] Assignee: General Electric Company, Schenectady, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/358,845

[22] Filed: Dec. 19, 1994

[51] Int. Cl.$^7$ ........................................... G01R 1/14
[52] U.S. Cl. ............................ 324/142; 324/126
[58] Field of Search .................... 324/126, 127, 324/141, 142, 156, 157, 129, 115; 338/49

[56] References Cited

U.S. PATENT DOCUMENTS

| | | | |
|---|---|---|---|
| 1,015,192 | 1/1912 | Knopp | 324/98 |
| 2,831,164 | 4/1958 | Johnson . | |
| 2,915,707 | 12/1959 | Bradstock et al. . | |
| 3,372,334 | 3/1968 | Fenoglio et al. . | |
| 3,665,357 | 5/1972 | Tsubouchi et al. . | |
| 3,943,440 | 3/1976 | Edwards | 324/95 |
| 4,009,477 | 2/1977 | Rozylowicz | 324/156 |
| 4,070,572 | 1/1978 | Summerhayes | 250/199 |
| 4,140,961 | 2/1979 | Akamatsu . | |
| 4,182,982 | 1/1980 | Wolf et al. | 324/127 |
| 4,240,059 | 12/1980 | Wolf et al. . | |
| 4,492,919 | 1/1985 | Milkovic | 324/127 |
| 4,494,068 | 1/1985 | Ley et al. . | |
| 4,513,246 | 4/1985 | Blain | 324/127 |
| 4,513,273 | 4/1985 | Friedl . | |
| 4,513,274 | 4/1985 | Halder . | |
| 4,580,095 | 4/1986 | De Vries . | |
| 4,626,778 | 12/1986 | Friedl . | |
| 4,684,827 | 8/1987 | Ohms . | |
| 4,749,939 | 6/1988 | Seitz . | |
| 4,794,326 | 12/1988 | Friedl . | |
| 4,810,989 | 3/1989 | Brandeberg et al. . | |
| 4,835,463 | 5/1989 | Baran et al. . | |
| 4,839,600 | 6/1989 | Kuurstra | 324/127 |
| 4,855,671 | 8/1989 | Fernandes | 324/127 |
| 4,894,610 | 1/1990 | Friedl . | |
| 4,939,451 | 7/1990 | Baran et al. . | |
| 5,027,059 | 6/1991 | de Montgolfier et al. . | |
| 5,066,904 | 11/1991 | Bullock | 324/127 |
| 5,107,204 | 4/1992 | Bullock et al. . | |
| 5,451,865 | 9/1995 | Coburn | 324/127 |
| 5,473,244 | 12/1995 | Libove et al. | 324/126 |
| 5,502,374 | 3/1996 | Cota | 324/127 |

FOREIGN PATENT DOCUMENTS

| | | | |
|---|---|---|---|
| 0627630 | 3/1994 | European Pat. Off. | G01R 15/02 |
| 1414931 | 9/1965 | France . | |
| 2638235 | 4/1997 | France | G01R 1/20 |

OTHER PUBLICATIONS

Bullock, et al., "GE Meter & Control," Mar. 1991, GE Meter and Control Business, Somersworth, NH, 4 pages.

Primary Examiner—Josie Ballato
Assistant Examiner—Russell M. Kobert
Attorney, Agent, or Firm—Armstrong, Teasdale, Schlafly & Davis; Carl B. Horton

[57] ABSTRACT

An electrical metering system includes an electrical meter which is free of current sensors and an external current sensor for producing an output signal related to electrical current conducted by a transmission line to an electrical load associated with the electrical meter such that the power consumption of the electrical load can be computed by the electrical meter. The current sensor generally can include an unbalanced bridge circuit for producing a scaled output signal related, according to a predetermined ratio to the electrical current conducted by the transmission line. The electrical meter generally includes a register, responsive to the output signal produced by the external current sensor, to tabulate load data related to the power consumption of the associated electrical load. By employing an external current sensor capable of providing relatively large current transformation ratios, the electrical meter need not include a current sensor and the design of the electrical metering system can be greatly simplified.

20 Claims, 5 Drawing Sheets

ELECTRICAL METERING SYSTEM HAVING AN ELECTRICAL METER AND AN EXTERNAL CURRENT SENSOR

FIELD OF THE INVENTION

The present invention relates to electrical metering systems and, more particularly, to electrical metering systems having a plurality of electrical meters.

BACKGROUND OF THE INVENTION

Conventional electrical metering systems include a plurality of electrical meters, such as induction or electronic type watthour meters, for measuring the energy consumption of individual electrical energy users. Each electrical meter generally includes metering circuitry for measuring the power consumption of the electrical load associated with the meter and for tabulating the load data related to the measured power consumption. The metering circuitry of conventional electrical meters generally includes an internal current sensor mounted within the housing of the electrical meter for sensing the line current supplied to the associated electrical load and for producing an output signal related to the line current.

For example, conventional induction watthour meters include a current sensing circuit in which the conductor carrying the line current is wrapped about an iron core to form a current coil. Magnetic flux is created in the iron core due to the line current which, in combination with the magnetic flux from a similar voltage coil, rotates a disc at a rate related, according to a predetermined ratio, to the customer's electrical energy consumption rate to thereby measure the power consumption of the associated electrical load.

In a number of instances, the range of line currents is relatively large, from very small line currents to relatively large line currents, such as 800 A, for example. Thus, the size of the conductor about the iron core to measure the relatively large range of line currents and to produce an output appropriately scaled output becomes prohibitively large. In such instances, a current transformer is typically employed in conjunction with the electrical meter and the internal current sensing device of the meter. In particular, a current transformer is generally disposed between the transmission line carrying the line current and the current sensing circuit and is located external to the electrical meter. For example, in an electrical metering system supplying electrical power to a three-phase electrical load, current transformers are typically connected to two or more of the bus bars extending from the switch gear of the electrical metering system to the electrical load.

Conventional current transformers also generally include an iron core about which a conductor carrying the line current is wrapped to form a current coil. The magnetic flux created in the iron core can, in turn, create a scaled output current, proportional to the line current which is supplied to the electrical load. The output current is sensed and further scaled by the internal current sensor of the electrical meter and the power consumption of the associated electrical load is computed, in part, therefrom. Accordingly, a relatively large transformation ratio can be established between the line current and the output signal of the internal current sensor of the electrical meter, such as 400,000:1 to convert 800 A of line current to a scaled output current of 2 mA, for example, by the combination of a current transformer and the internal current sensing device of an electrical meter.

The need for large current transformation ratios is particularly apparent in electrical metering systems which include electronic electricity meters, such as electronic watthour meters or other electronic metering devices. Exemplary electronic electricity meters include GE Type EV™ and Phase3™ meters which are sold by General Electric Company of Somersworth, N.H. These electronic electricity meters typically include integrated circuits for measuring the current and voltage usage of individual electrical energy customers. The integrated circuits are generally Application Specific Integrated Circuits ("ASIC") which are designed to accept and measure small signal levels, such as less than 2 mA and less than 5 volts. The combination of the current transformers and the internal current sensors of such electronic electricity meters must thus provide a large transformation ratio to scale the relatively large line currents, such as 800 A, to the relatively small input levels, such as 2 mA, accepted by the integrated circuits. As described above, the number of windings required to properly scale the line current and to provide the required transformation ratio can quickly become prohibitively large and expensive.

Various other types of current sensors have been developed for incorporation into an electrical meter which scale a line current to a level measurable by an electrical meter. For example, the current sensors described in U.S. Pat. No. 4,182,982 to Wolf, et al. which issued Jan. 8, 1980 and U.S. Pat. No. 4,492,919 to Milkovic which issued Jan. 8, 1985 include one or more main shunt paths and a parallel, auxiliary shunt path between which the line current divides based upon their respective cross-sectional areas. The resulting current conducted by the auxiliary shunt path can be sensed to produce a scaled output signal.

In addition, a coaxial current sensor is disclosed in U.S. Pat. No. 5,066,904 to Bullock which issued on Nov. 19, 1991 and is assigned to the assignee of the present invention. The coaxial current sensor divides the line current between two coaxially-arranged conductors. The center conductor of the coaxial current sensor extends through the bore of a toroidal core and induces a magnetomotive force in the toroidal core from which a scaled output signal can be produced.

Still further, a differential current sensor is disclosed in U.S. patent application Ser. No. 08/043,903 to Coburn filed Apr. 7, 1993, now abandoned, and also assigned to the assignee of the present invention. The differential current sensor divides a line current into first and second portions according to a predetermined ratio and senses the current differential therebetween. Based upon the sensed current differential, a scaled output current can be produced.

SUMMARY OF THE INVENTION

It is therefore an object of the present invention to provide an improved electrical metering system for measuring the power consumption of an associated electrical load.

It is another object of the present invention to provide a simplified electrical metering system for measuring the electrical power consumption of an associated electrical load which is less expensive than conventional electrical metering systems.

These and other objects are provided, according to the present invention, by an electrical meter which tabulates load data related to the power consumption of an associated electrical load, and a current sensor, external to the electrical meter, for producing an output signal related to the electrical current conducted by a transmission line to the associated electrical load. Accordingly, the electrical meter of the present invention tabulates the load data without a current sensor. By not including a current sensor, the design of the electrical meter can be simplified and the resulting cost and complexity of electrical metering systems employing such electrical meters can be reduced in comparison to conventional electrical metering systems which include one or more current transformers and an associated electrical meter having an internal current sensor.

According to one embodiment, the magnitude of the output signal produced by the external current sensor is less than a first predetermined maximum value. According to this embodiment, the electrical meter includes register means for processing the output signals produced by the external current sensor and for tabulating load data based upon the output signals. The magnitude of the output signals which the register means processes are preferably no greater than a second predetermined maximum value, which is greater than the first predetermined maximum value. Thus, the electrical meter can process the output signals produced by the external current sensor without further reducing the magnitude of the output signals.

The current sensor can include bridge circuit means for receiving and dividing the electrical current conducted by the transmission line into predetermined portions. The bridge circuit means generally includes an unbalanced bridge circuit having first and second branches for conducting first and second portions of the electrical current, respectively. A center conductor interconnects the first and second branches and conducts a current related to the electrical current connected by the transmission line. The current sensor also preferably includes sensing means, such as an annular current comparator, magnetically coupled to the center conductor, for producing an output signal related to the current conducted by the center conductor and, consequently, the current conducted by the transmission line.

According to one embodiment, the first branch includes first and second conductors, such as resistors, having first and second predetermined resistances, respectively. Likewise, the second branch includes third and fourth conductors, such as resistors, having third and fourth predetermined resistances, respectively. Further, the center conductor can also be a resistor having a fifth predetermined resistance which extends from a first end between the first and second conductors to the second end between the third and fourth conductors.

Preferably, the ratio of the first and second predetermined resistances to the third and fourth predetermined resistances remains constant as the temperature of the conductors vary. According to one embodiment, the first and fourth conductors consist of first and second materials, and the second and third conductors consist of the second material. The specific materials are preferably chosen such that the resistivity of the first material varies less than the resistivity of the second material as the temperatures of the materials vary. However, the conductors preferably contain predetermined amounts of the second material such that the ratio of the resistances of the first and second branches does not vary as the temperature of the materials vary.

By including a current sensor external to the electrical meter and eliminating the internal current sensor of the electrical meter, the design of the electrical meter is simplified. In addition, the cost and complexity of electrical metering systems employing such electrical meters is reduced in comparison to conventional electrical metering systems which include one or more current transformers and an associated electrical meter having an internal current sensor. Still further, the design of the external current sensor of the present invention provides for a consistent current transformation ratio which is independent of temperature fluctuations such that an output signal related to the magnitude and phase of the input electrical current is accurately produced.

DETAILED DESCRIPTION OF THE PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiments set forth herein; rather, this embodiment is provided so that this disclosure will be thorough and complete and will fully convey the scope of the invention to those skilled in the art. Like numbers refer to like elements throughout.

Figure 1:
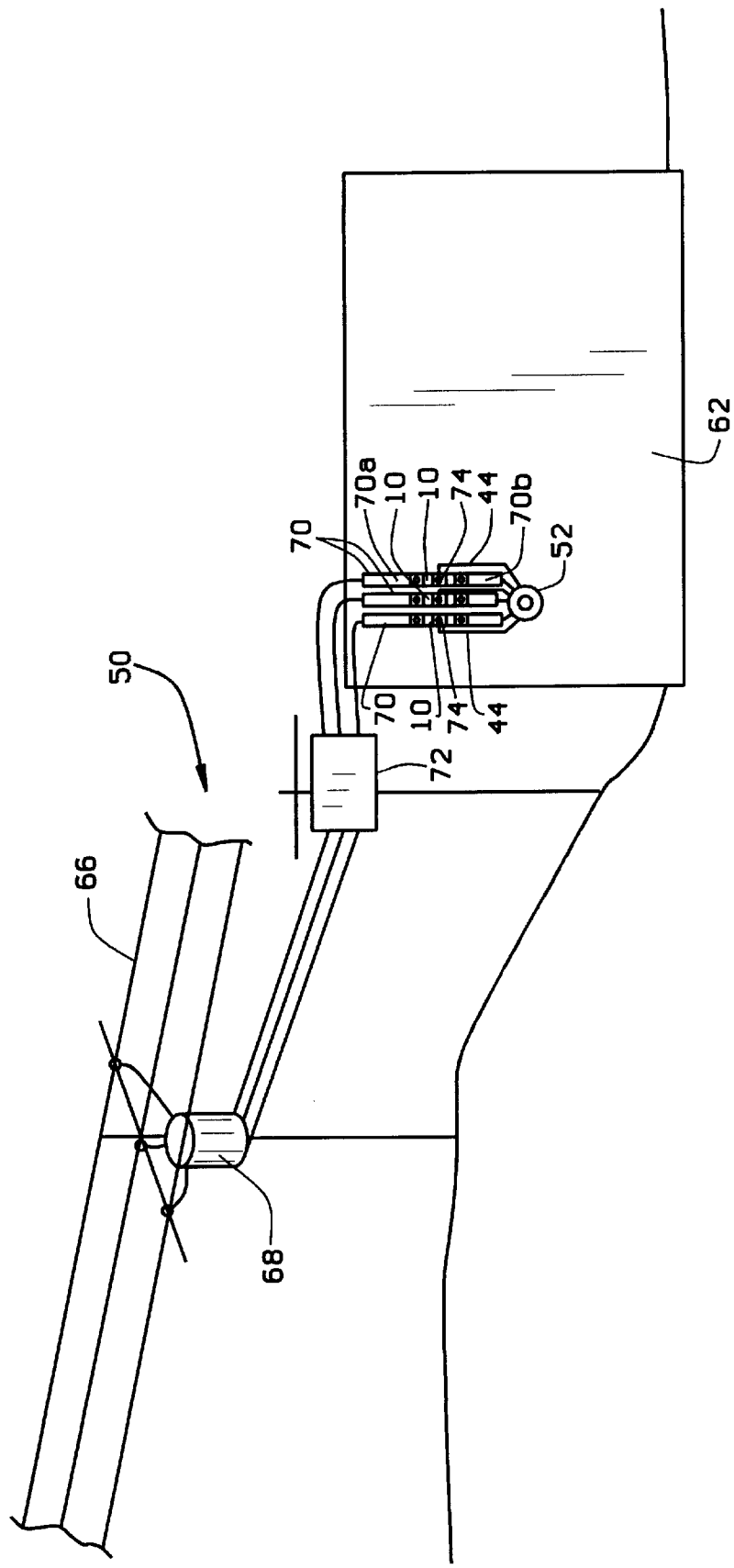
FIG. 1 is a perspective view of an electrical metering system according to the present invention.
Figure 3:
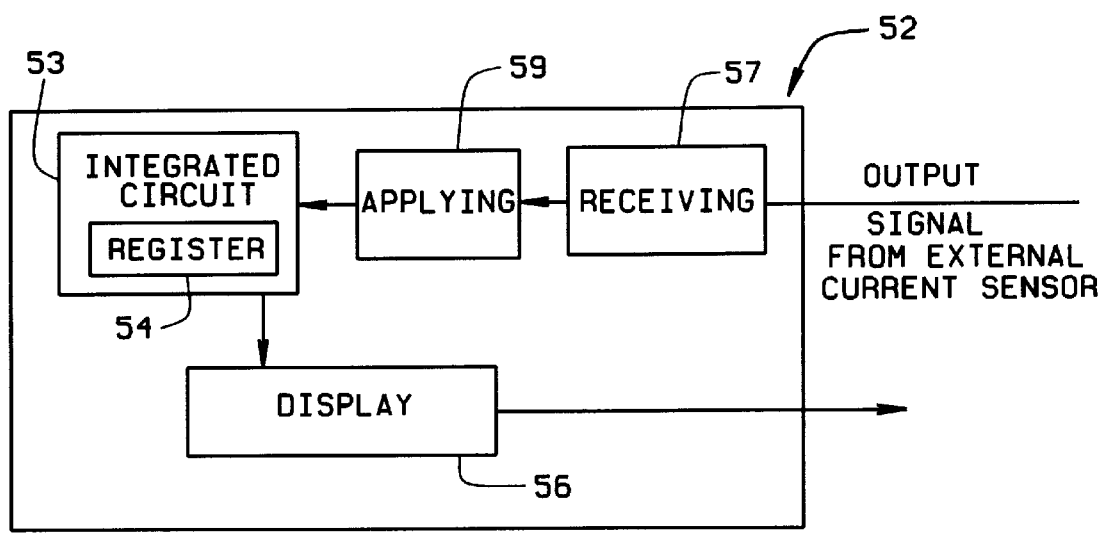
FIG. 3 is a block diagram of an electrical meter of the present invention illustrating the transfer of an output signal from an external current sensor.

Referring now to FIG. 1, an electrical metering system 50 according to the present invention is illustrated. The electrical metering system includes an electrical meter 52 for tabulating load data related to the power consumption of the associated electrical load. The load data can include, among other quantities, the energy consumption in watthours, the power factor and the peak demand within a predetermined time period. As illustrated in FIG. 3, the electrical meter includes an integrated circuit 53 which includes register means 54 for tabulating the load data. The electrical meter can also include display means 56 for providing a display of the load data generated by the electrical meter.

Figure 2:
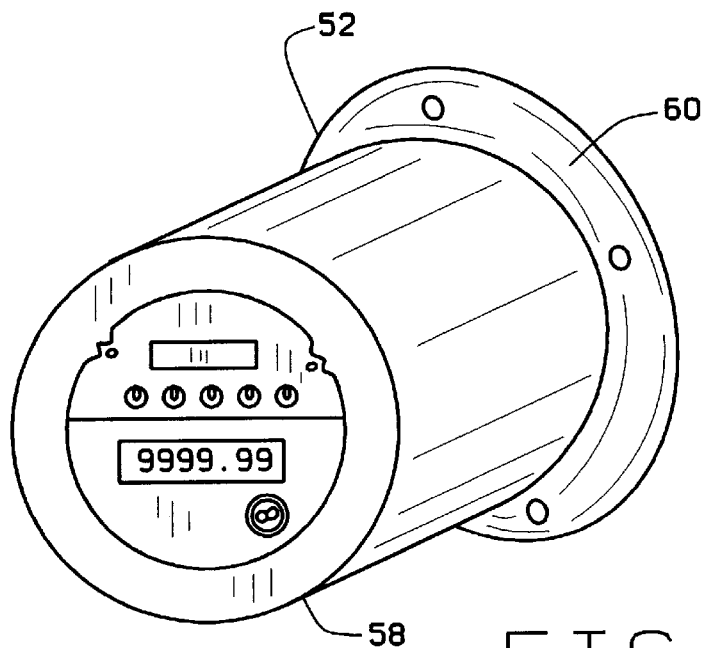
FIG. 2 is a perspective view of an electrical meter according to the present invention illustrating the meter housing and the meter base.

The electrical meter 52 also generally includes a meter housing 58 defining an internal cavity therein, as shown in FIG. 2. As known to those skilled in the art, the meter housing protects the internal components of the meter from environmental hazards and from tampering. Typically, the integrated circuit 53 including the register means 54, the display means 56, and the other components of the electrical meter are disposed within the cavity defined by the meter housing. The meter housing is, in turn, mounted to a meter base 60 on, for example, the exterior wall of a building 62.

The electrical metering system 50 illustrated in FIG. 1 also includes one or more current sensors 10, external to the electrical meter 52, and responsive to the electrical current conducted by a transmission line 66 to the associated electrical load. Typically, the transmission line is a secondary line extending from a distribution transformer 68 to an electrical load. For example, in the illustrated embodiment, the transmission line includes a plurality of bus bars 70 extending between the switch gear 72 of the electrical metering system and a three-phase electrical load. While a three-phase electrical load is illustrated, the electrical metering system can also be employed with single-phase electrical loads without departing from the spirit and scope of the present invention.

Figure 4:
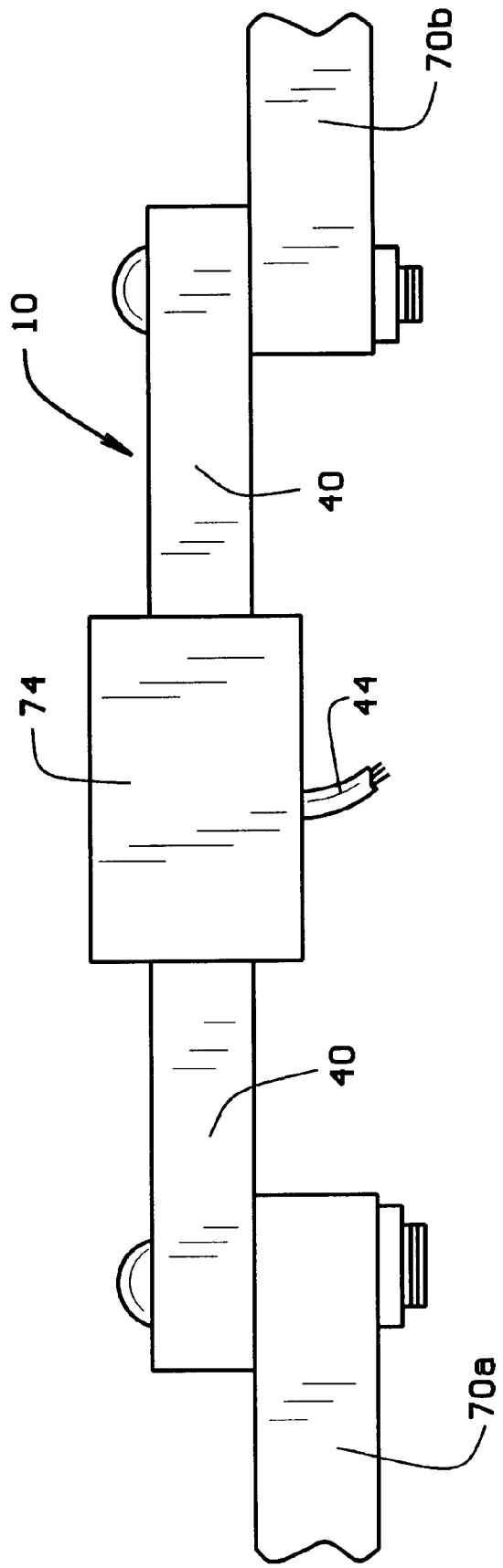
FIG. 4 is a fragmentary side view of the external current sensor of the present invention illustrating its connection to the first and second spaced apart portions of a bus bar.
Figure 5:
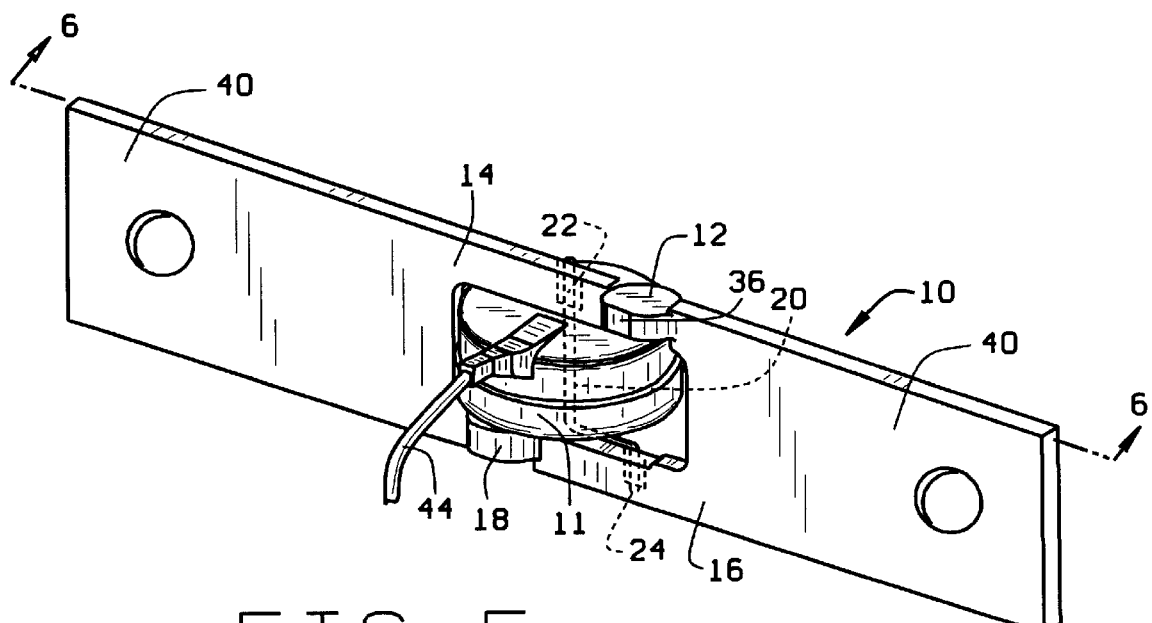
FIG. 5 is a perspective view of an external current sensor according to the present invention.
Figure 6:
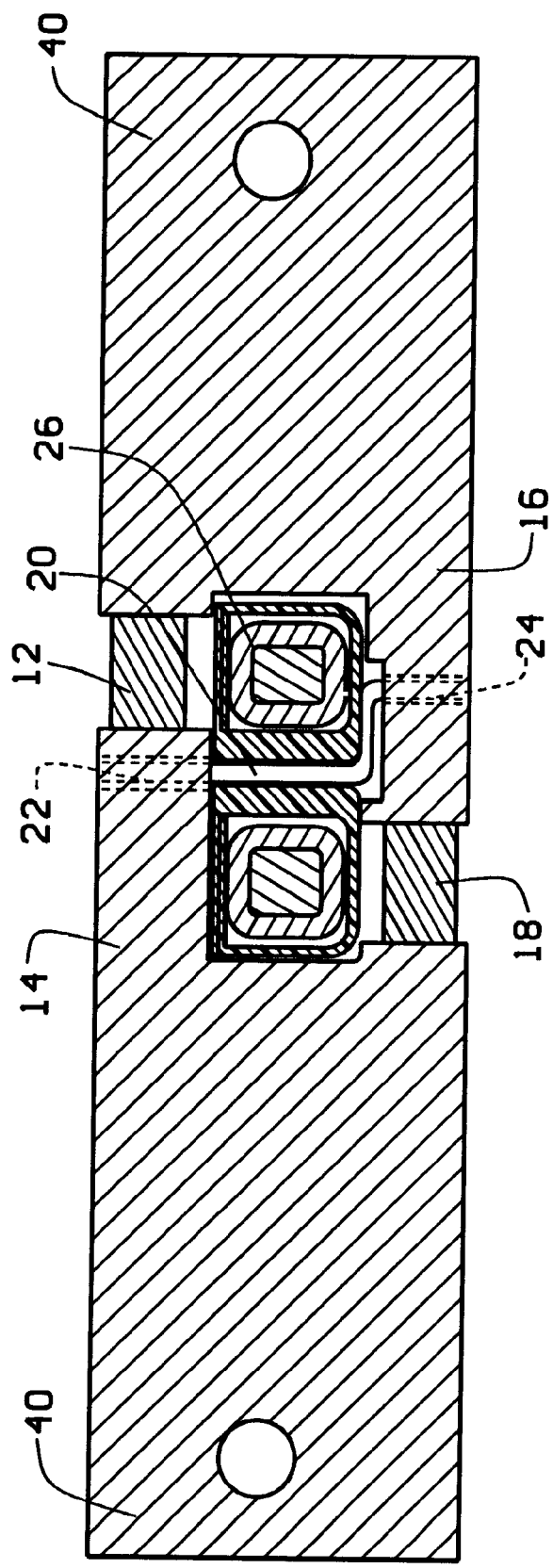
FIG. 6 is an enlarged cross-sectional view of the external current sensor of FIG. 5 taken along line 6—6 of FIG. 5.

As illustrated in FIGS. 1 and 4, the bus bars 70 can include first and second spaced apart portions 70*a* and 70*b*. Correspondingly, the current sensor 10 can include first and second outwardly extending arms 40, as best shown in FIGS. 5 and 6, which bridge between and electrically connect the first and second spaced apart bus bar portions. As explained in detail below, the current sensor produces an output signal $I_{OUT}$ related to the electrical current $I_{IN}$ conducted by the transmission line 66, such as a bus bar. Preferably, the output signal is a scaled representation of the electrical current conducted by the transmission line according to a predetermined transmission ratio. More preferably, the output signal is relatively lower in current than the current conducted by the transmission line.

The output signal is provided to the electrical meter 52 and, in particular, the register means 54 of the electrical meter, by providing means, such as one or more electrical leads 44 extending between the external current sensor 10 and the electrical meter. As illustrated in FIG. 3, the electrical meter includes means 57, such as an optional signal conditioning circuit, for receiving the output signals from the external current sensor. The electrical meter also preferably includes means 59, such as an analog to digital converter which is responsive to the receiving means, for applying the scaled output signals to the integrated circuit 53 and, more particularly, the register means such that the register means can tabulate load data related to the power consumption of the associated electrical load based thereupon. Accordingly, the electrical meter does not include a current sensor such that the design of the electrical meter is greatly simplified.

Figure 7:
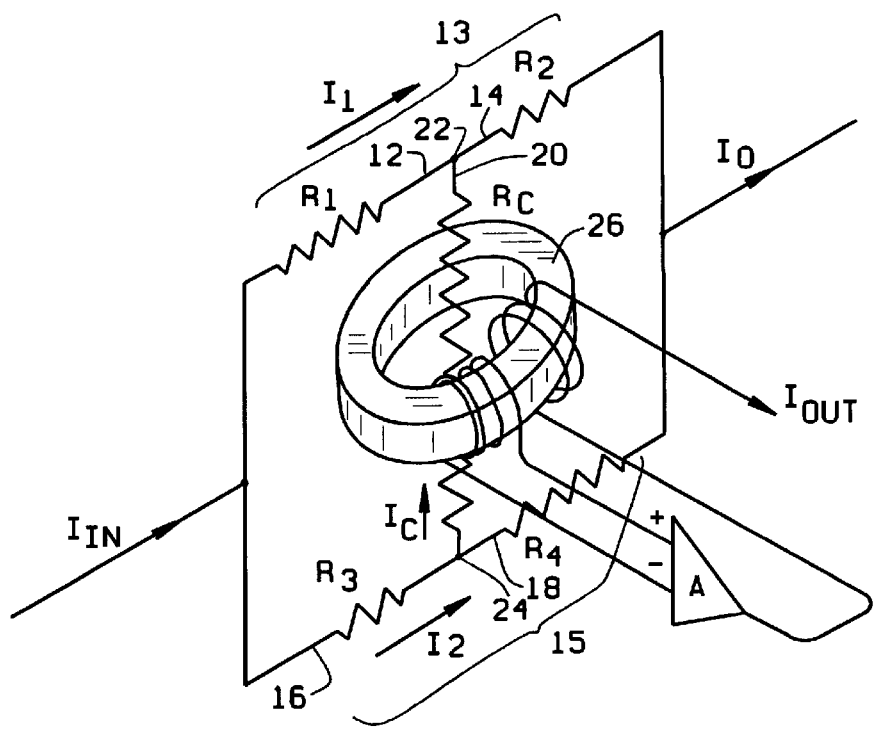
FIG. 7 is an electrical schematic of the external current sensor of FIG. 5.

According to a preferred embodiment, the external current sensor 10 includes bridge circuit means, such as an unbalanced bridge circuit. One preferred current sensor including bridge circuit means is the current sensing method and apparatus disclosed in U.S. Pat. No. 5,451,865 to Coburn which issued Sep. 19, 1995 and is assigned to the assignee of the present invention, the contents of which are incorporated herein by reference. As illustrated in FIGS. 5–7, the external current sensor of this embodiment includes bridge circuit means for receiving and dividing the electrical current $I_{IN}$ conducted by the transmission line 66 into predetermined portions. More particularly, the bridge circuit means includes first and second branches 13 and 15 for conducting first and second portions $I_1$ and $I_2$ of the electrical current, respectively. A center conductor 20 interconnects the first and second branches and conducts a current $I_c$ based upon the current differential between the first and second branches and related, according to a predetermined ratio, to the electrical current conducted by the transmission line.

The current sensor 10 also preferably includes sensing means, such as an annular current comparator 26, magnetically coupled to the center conductor for producing an output signal $I_{OUT}$ related to the current $I_c$ conducted by the center conductor and, in turn, related to the electrical current $I_{IN}$ conducted by the transmission line. In particular, the output signal is a scaled representation of the electrical current conducted by the transmission line according to a predetermined transformation ratio.

As shown in FIGS. 5–7, the first branch 13 of the bridge circuit means includes first and second conductors 12 and 14, such as resistors, having first and second predetermined resistances $R_1$ and $R_2$, respectively. Likewise, the second branch 15 includes third and fourth conductors 16 and 18, such as resistors, having third and fourth predetermined resistances $R_3$ and $R_4$, respectively. Further, the center conductor 20 is generally an interconnecting resistor having a fifth predetermined resistance $R_c$ which extends from a first end 22 between the first and second conductors of the first branch to a second end 24 between the third and fourth conductors of the second branch.

Preferably, the ratio of the resistances of the first and second branches 13 and 15, i.e., the ratio of the first and second predetermined resistances to the third and fourth predetermined resistances, remains constant as the temperature of the conductors vary. In order to provide a constant ratio of resistances, the first and fourth conductors 12 and 18 are preferably comprised of a combination of first and second materials, as shown in different cross-hatching in FIG. 6, which are welded together, such as by a conventional electron-beam welding process. In contrast, the second and third conductors 14 and 16 are preferably comprised exclusively of the second material. In addition, the center conductor 20 is also preferably comprised of the first material.

While various materials can be used without departing from the spirit and scope of the present invention, the first material is preferably a copper nickel alloy, such as Copel, or a manganese copper nickel alloy, such as Manganin. Preferably, the resistance of the first material does not vary significantly with temperature. For example, the temperature coefficient of resistance of Manganin varies 0.000015 $\Omega/\Omega/°$C. In contrast, the second material, such as copper or aluminum, preferably has a relatively low resistivity in comparison to the first material. For example, the resistivity of the first material is preferably at least twenty-five times greater than the resistivity of the second material. Thus, the resistance of the second and third conductors 14 and 16 is preferably small in comparison to the resistance of the first and fourth conductors 12 and 18 which include the first material having a relatively high resistivity. However, the resistance of the second material typically varies with temperature to a much greater degree than the first material.

Even though the resistance of the second material varies with temperature, the performance of the current sensor 10 preferably does not vary with temperature. Thus, the transformation ratio established by the predetermined resistances of the respective conductors should be independent of temperature. Accordingly, the ratio of the first and second predetermined resistances to the third and fourth predetermined resistances preferably remains constant as the temperature of the conductors vary. The relative magnitude and phase of the current $I_c$ in the center conductor $I_{IN}$ to the electrical current conduct by the transmission line 66 will therefore remain constant as the temperature varies.

Since the second material, such as copper, has a resistance which varies with temperature, each conductor preferably contains predetermined amounts of the second material such that the ratio of the first and second predetermined resistances to the third and fourth predetermined resistances is, as a whole, independent of temperature variations. In particular, the center conductor 20 need not be linear, but may be configured, as shown in FIGS. 5 and 6, such that each conductor contains the predetermined amount of the second material. For example, one end, such as the second end 24 as shown in FIGS. 5 and 6, can be selectably positioned such that the ratio of the resistances of the first and second branches 13 and 15 remain constant and independent of temperature.

By employing a current sensor 10 having an unbalanced bridge circuit as described above and, in more detail, in U.S. Pat. No. 5,451,865 to Coburn which issued Sep. 19, 1995, the current sensor is not only impervious to temperature fluctuations, but can also provide the large transformation ratios required to scale large line currents $I_{IN}$, such as 800 A, to the low levels demanded by the register means 54 of electricity meters 52. In addition, a current sensor having an unbalanced bridge circuit provides the large transformation ratios, such as 800 A:2 mA, without being unnecessarily large.

According to one embodiment, the magnitude of the output signal $I_{OUT}$ produced by the external current sensor 10 is less than a first predetermined maximum value. According to this embodiment, the register means 54 is adapted to process output signals having a magnitude no greater than a second predetermined maximum value. The second predetermined maximum value is preferably greater than the first predetermined maximum value such that the electrical meter 52 can process the output signals without further reducing the magnitude of the output signals. Thus, the electrical meter of the present invention need not include a current sensor.

While the particular configuration of the current sensor can be widely varied, it is preferred that the current sensor 10 be disposed within a current sensor housing, external to the electrical meter 52, for environmentally protecting the current sensor and to facilitate the operation and longevity of the current sensor, as shown in FIG. 4. For example, the current sensor housing can be comprised of an insulating material, such as plastic.

By eliminating the internal current sensor from the electrical meters of conventional electrical metering systems, a simplified electrical meter 52 and, consequently, a simplified electrical metering system 10 is provided. Due to the simplified design, electrical meters and electrical metering systems of the present invention are believed to be less expensive than conventional electrical meters and electrical metering systems.

In the drawings and the specification, there has been set forth preferred embodiments of the invention and, although specific terms are employed, the terms are used in a generic and descriptive sense only and not for purpose of limitation, the scope of the invention being set forth in the following claims.

That which is claimed is:

1. An electrical metering system for measuring the power consumption of an associated electrical load coupled to a transmission line, said electrical metering system comprising:

a current sensor, responsive to an electrical current conducted by the transmission line to the associated electrical load, configured to accurately produce an output signal of less than 2 mA, said output signal being related to the electrical current conducted by the transmission line, said current sensor configured to be electrically coupled to the transmission line and to the load to conduct at least a portion of the transmission line current supplied to the load; and an electrical meter, responsive to said current sensor and a voltage sensing means, for tabulating load data related to the power consumption including power factor data of the associated electrical load based upon the output signals produced by said current sensor and said voltage sensing means, wherein said current sensor is external to said electrical meter and its housing such that said electrical meter is free of said current sensor.

2. An electrical metering system according to claim 1 wherein the magnitude of the output signal produced by said current sensor is less than a first predetermined maximum value, and wherein said electrical meter includes register means for processing the output signals produced by said current sensor and for tabulating load data based upon the output signals, the magnitude of the output signals which said register means processes being no greater than a second predetermined maximum value, the second predetermined maximum value being greater than the first predetermined maximum value such that said electrical meter can process the output signals without further reducing the magnitude of the output signals.

3. A electrical metering system according to claim 1 wherein said current sensor comprises:

first and second resistors having first and second predetermined resistances, respectively, for conducting a first portion of an input current;

third and fourth resistors having third and fourth predetermined resistances, respectively, for conducting a second portion of an input current;

an interconnecting resistor having a fifth predetermined resistance for conducting current between a first end between said first and second resistors to a second end between said third and fourth resistors; and an annular current comparator responsive to the current conducted by said interconnecting resistor for producing the output signal related to the electrical current conducted by the transmission line.

4. An electrical metering system according to claim 3 wherein the ratio of the first and second predetermined resistances to the third and fourth predetermined resistances remains constant as the temperature of said first, second, third and fourth conductors varies.

5. An electrical metering system according to claim 4 wherein said first and fourth conductors each consist of first and second materials and said second and third conductors each consist of the second material.

6. An electrical metering system according to claim 5 wherein the resistivity of the first material varies less than the resistivity of the second material as the temperatures of the first and second materials vary, and wherein said conductors contain predetermined amounts of said second material such that the ratio of the first and second predetermined resistances to the third and fourth predetermined resistances does not vary as the temperature of the first and second materials vary.

7. An electrical metering system for measuring the power consumption of an associated electrical load, the electrical metering system comprising:

a current sensor comprising bridge circuit means for receiving and dividing an electrical current conducted by a transmission line to the associated electrical load into predetermined portions, said bridge circuit means comprising:

first and second branches for conducting first and second portions of the electrical current, respectively; and a center conductor for interconnecting said first and second branches and for conducting a current related to the electrical current conducted by the transmission line;

said current sensor further comprising sensing means, magnetically coupled to said center conductor, for accurately producing an output signal of less than 2 mA related to the current conducted by said center conductor, wherein the magnitude of the output signal produced by said current sensor is less than a first determined maximum value; and an electrical meter for processing the output signals produced by said current sensor and a voltage sensing means, and for tabulating load data based upon the output signals of said current sensor and said voltage sensing means, wherein said current sensor is external to said electrical meter, and wherein the magnitude of the output signals of said current sensor which said electrical meter processes being no greater than a second predetermined maximum value, the second predetermined maximum value being greater than the first predetermined maximum value such that said electrical meter can process the output signals without further reducing the magnitude of the output signals.

8. An electrical metering system according to claim 7 wherein said first branch comprises first and second conductors having first and second predetermined resistances, respectively, and wherein said second branch comprises third and fourth conductors having third and fourth predetermined resistances, respectively.

9. An electrical metering system according to claim 8 wherein said center conductor has a fifth predetermined resistance and extends from a first end between said first and second conductors of said first branch to a second end between said third and fourth conductors of said second branch.

10. An electrical metering system according to claim 9 wherein the ratio of the first and second predetermined resistances to the third and fourth predetermined resistances remains constant as the temperature of said conductors varies.

11. An electrical metering system according to claim 10 wherein said first and fourth conductors consist of first and second materials and said second and third conductors consist of the second material.

12. An electrical metering system according to claim 11 wherein the resistivity of said first material varies less than the resistivity of said second material as the temperatures of the first and second materials vary, and wherein said conductors contain predetermined amounts of said second material such that the ratio of the first and second predetermined resistances to the third and fourth predetermined resistances does not vary as the temperature of the first and second materials vary.

13. An electrical metering system according to claim 7 wherein said current sensor further comprises first and second arms connected to first and second ends, respectively, of both said first and second branches, said first and second arms being adapted to electrically contact the transmission line conducting electrical current to the associated electrical load.

14. An electrical metering system according to claim 13 wherein the transmission line for conducting electrical current to the associated electrical load comprises a bus bar having first and second spaced apart portions, and wherein said first and second arms include means for connecting to said first and second bus bar portions, respectively, and for conducting electrical current therebetween.

15. An electrical metering system for measuring the power consumption of an associated electrical load coupled to a transmission line conducting an electrical current, said electrical metering system comprising:

a current sensor for accurately producing an output signal, said output signal being related to the electrical current conducted by the transmission line, said current sensor configured to be electrically coupled to the transmission line and to the load to conduct at least a portion of the electrical current supplied to the load, said current sensor configured to provide a transformation ratio of about 800A:2 mA; and an electrical meter, responsive to said current sensor and a voltage sensing means, for tabulating load data related to the power consumption including power factor data of the associated electrical load based upon the output signals produced by said current sensor and said voltage sensing means.

16. An electrical metering system in accordance with claim 15 further comprising a housing surrounding said electrical meter, wherein said current sensor is external to said electrical meter and said housing such that said electrical meter is free of said current sensor.

17. An electrical metering system in accordance with claim 15 wherein the transmission line for conducting electrical current to the associated electrical load comprises at least one bus bar having first and second spaced apart portions, and wherein said current sensor includes means for connecting to said first and second bus bar portions, respectively, and for conducting electrical current therebetween.

18. An electrical metering system in accordance with claim 15 wherein said current sensor comprises first and second arms being adapted to electrically contact the transmission line conducting the electrical current to the associated electrical load.

19. An electrical metering system in accordance with claim 15 wherein said current sensor comprises:

first and second resistors having first and second predetermined resistances, respectively, for conducting a first portion of an input current;

third and fourth resistors having third and fourth predetermined resistances, respectively, for conducting a second portion of an input current; and an interconnecting resistor having a fifth predetermined resistance for conducting current between a first end between said first and second resistors to a second end between said third and fourth resistors.

20. An electrical metering system in accordance with claim 19 wherein the ratio of the first and second predetermined resistances to the third and fourth predetermined resistances remains constant as the temperature of said first, second, third, and fourth conductors varies.

\* \* \* \* \*